(12) United States Patent  
Lindenberger

(10) Patent No.: US 6,750,738 B2  
(45) Date of Patent: Jun. 15, 2004

(54) ELECTRIC FILTER AND MOTOR VEHICLE WIRING SYSTEM WITH SUCH FILTER

(75) Inventor: Heinz Lindenberger, Augsburg (DE)

(73) Assignee: Continental ISAD Electronic Systems GmbH & Co., oHG, Landsberg (DE)

( * ) Notice: Subject to any disclaimer, the term of this patent is extended or adjusted under 35 U.S.C. 154(b) by 0 days.

(21) Appl. No.: 10/402,748

(22) Filed: Mar. 28, 2003

(65) Prior Publication Data

US 2003/0227355 A1 Dec. 11, 2003

(30) Foreign Application Priority Data

Mar. 28, 2002 (EP) .......................................... 02007182

(51) Int. Cl.⁷ ............................................... H03H 7/01
(52) U.S. Cl. ...................... 333/182; 333/184; 333/185
(58) Field of Search ................................. 333/181, 182, 333/184, 185, 238; 361/270; 336/200

(56) References Cited

U.S. PATENT DOCUMENTS

| 2,756,375 A | 7/1956 | Peck |
| 4,935,842 A | 6/1990 | Carlson et al. |
| 5,105,332 A | 4/1992 | Moffitt |
| 6,037,846 A | 3/2000 | Oberhammer |
| 6,346,865 B1 * | 2/2002 | Callewaert et al. ......... 333/185 |

FOREIGN PATENT DOCUMENTS

| EP | 0 216 389 A2 | 4/1987 | |
| JP | 9-214272 A * | 8/1977 | ............ H03H/7/01 |
| JP | 6-325977 A * | 11/1994 | ............ H01G/4/40 |

* cited by examiner

Primary Examiner—Benny Lee  
Assistant Examiner—Dean Takaoka  
(74) Attorney, Agent, or Firm—Blakely, Sokoloff, Taylor & Zafman; Stephen M. De Klerk

(57) ABSTRACT

An electric filter having means for buffering high-frequency interference in a high-current environment, comprising a feed-through conductor, a derivation conductor, and one or more capacitors. The one or more capacitors are switched between the feed-through conductor and the derivation conductor. The feed-through conductor is directed around the capacitor. A motor vehicle wiring system can be equipped with such a filter.

28 Claims, 4 Drawing Sheets

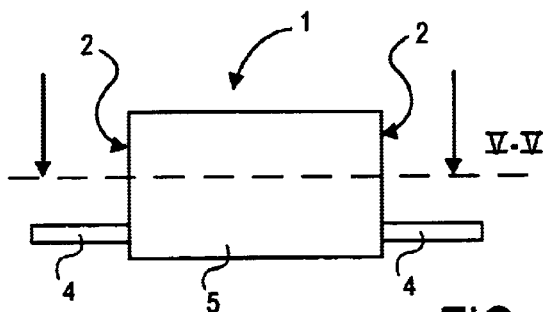
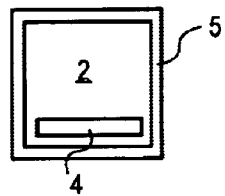
FIG. 1          FIG. 3
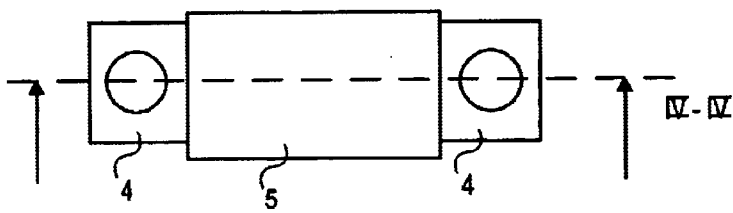
FIG. 2
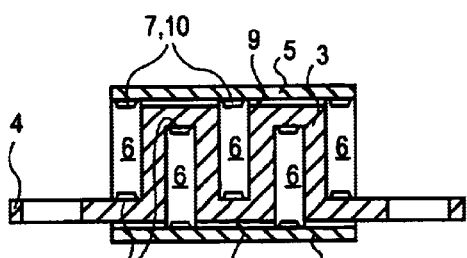
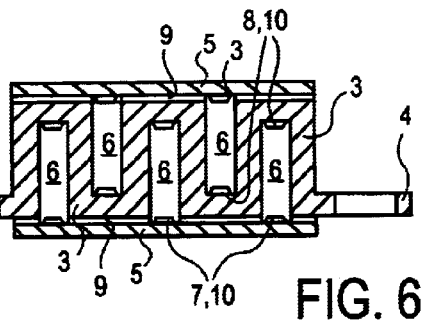
FIG. 4          FIG. 6
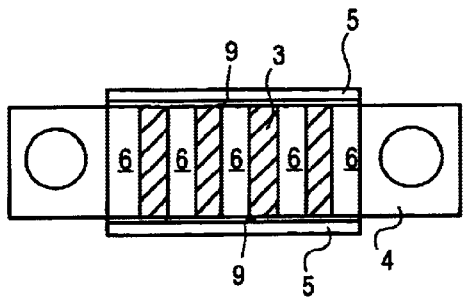
FIG. 5

US 6,750,738 B2

ELECTRIC FILTER AND MOTOR VEHICLE WIRING SYSTEM WITH SUCH FILTER

CROSS-REFERENCE TO OTHER APPLICATIONS

This Application claims priority from European Patent Application No. 02 007 182.5, filed on Mar. 28, 2002.

FIELD OF THE INVENTION

The invention relates to electric filters having means for buffering high-frequency interference in a high-current environment and a motor vehicle wiring system with such filters.

BACKGROUND OF THE INVENTION

Said filters are used for example in direct current power supply systems, wiring systems of motor vehicles, rail cars or aircraft. Such wiring systems generally put a lot of strain on the electromagnetic compatibility (EMC) in the sense that the output potential of the power supply only allow very small higher frequency interference. Said filters are often meant to be embedded in a protective chassis (e.g., the chassis of the source of electric power), enabling said filters to feed the output conductor through the chassis at the same time. Consequently, they are called "feed-through-filters."

U.S. Pat. Nos. 2,756,375, 4,935,842, and 5,105,332 are directed to the foregoing type of filters with only one capacitor. In the case of a filter following said U.S. patents, the capacitor is embedded in a flange-like expansion of a derivation conductor encompassing the output conductor in a chassis-like way.

The volume required and buffering obtained by known filters are not quite perfect, especially in high-current environments.

SUMMARY OF THE INVENTION

The present invention provides an electric filter buffering high-frequency interference in a high-current environment. The filter comprises a feed-through conductor, and a minimum of one capacitor secured between the feed-through conductor and the derivation conductor. The feed-through conductor is rotated about at least one capacitor.

Another object of the invention is to provide an electric filter buffering high-frequency interference in a high-current environment and comprising a feed-through conductor, a derivation conductor, and at least one capacitor. The feed-through conductor is contained within the derivation conductor. The capacitor is contained within the derivation conductor and connects the feed-through conductor with the derivation conductor. The feed-through conductor contained within the derivation conductor passes rotates about the capacitor (at least one).

Still another object of the invention is to provide an electric filter buffering high-frequency interference in a high-current environment and comprising a feed-through conductor, a derivation conductor, and several capacitors connected in parallel between the feed-through conductor and the derivation conductor. The feed-through conductor is rotated about the capacitor.

Yet another object of the invention is to provide a motor vehicle wiring system with a filter buffering high-frequency interference stemming from a connected power source of the motor vehicle wiring system. The filter comprises a feed-through conductor, a derivation conductor, and several capacitors connected in parallel between the feed-through conductor and the derivation conductor. The feed-through conductor is rotated about the capacitors.

DESCRIPTION OF THE DRAWINGS

The objects and features of the invention will be apparent from the following description of a preferred embodiment taken in connection with the accompanying drawings, in which:

FIG. 1 shows a side view of a filter.

FIG. 2 shows a top view of the filter embodiment of FIG. 1.

FIG. 3 shows a front view of the filter embodiment of FIGS. 1 and 2.

FIG. 4 shows a sectional view following line IV—IV in FIG. 2.

FIG. 5 shows a sectional view following line V—V in FIG. 1.

FIG. 6 shows the same view as FIG. 4, yet for a different embodiment with a fully meandering conductor.

DETAILED DESCRIPTION OF THE PREFERRED EMBODIMENTS

Figure 7:
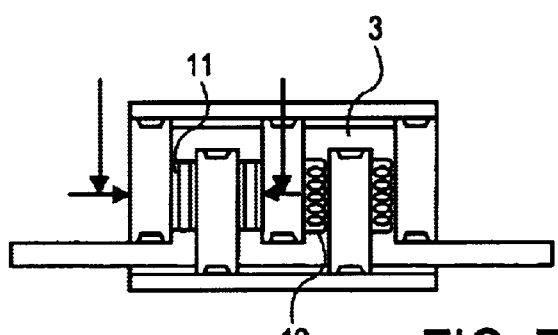
FIG. 7 shows a view similar to FIG. 1 and illustrates different embodiments with additional induction-enhancing means.

FIG. 1 shows a side view of a filter embodiment having means for buffering high-frequency interference in a high-current environment. Below are a few more general remarks on the embodiments, followed by a detailed description of FIG. 1.

The filter embodiments shown in the Figures each comprise five capacitors, which means that they are five-step filters. Please note that this is only an example and fewer (e.g., two) or more (e.g., eight) capacitors are possible, depending on the desired filter performance (resulting, for example, in two-step or eight-step filters). The filter embodiments shown can also comprise only one capacitor (resulting in a one-step filter).

In the embodiments shown in FIGS. 1 through 5 and 7, the feed-through conductor rotates about the capacitors in a part L-shaped and part U-shaped pattern (i.e., partially around two sides and partially around three sides of a capacitor). This means that the object described in claim 1, i.e., with the feed-through conductor rotating about the capacitor, relates to an embodiment rotated about two sides, or in particular rotated about three sides (which is preferred most). In the preferred embodiment shown in FIG. 6, the feed-through conductor is rotated about all capacitors in a U-shaped pattern.

In said embodiments, the derivation conductor encompasses the feed-through conductor. In this case, the derivation conductor, which is usually disposed on a ground enabling to realize the filter function, can also serve as a protective means for the filter. This enables the filter to be used as a so-called feed-through filter, i.e., a filter disposed at the feed-through of a conductor through a protective chassis, wherein said derivation conductor is directly disposed on the (grounded) protective chassis and connected with said chassis.

The capacitor of said embodiments presents two opposite connecting sides as well as insulating sides. In the U-shaped pattern, the feed-through conductor is rotated about an insulating side, a connecting side, and a second insulating side. In this case, the feed-through conductor is electrically connected with said connecting side of the capacitor; the second connecting side of the capacitor, on the other hand, is electrically connected with the derivation conductor. Because of the diversion, the feed-through conductor is extended in comparison with known state of the art filters, and thus presents a relatively high induction. The feed-through conductor and the capacitor connected with the derivation conductor create a low-pass filter, allowing direct current and currents with a frequency below the low-end frequency to flow through virtually without buffering, while buffering currents above the low-end frequency.

In the preferred embodiments, the feed-through conductor creates a pocket embedding the capacitor at the U-shaped diversion. Besides said electric function of induction increase, the U-shaped diversion also presents a mechanical embedding function.

The embodiments illustrated in the figures present contact springs on both connecting points, i.e., at the contact point with the feed-through conductor on one side, and the contact point with the derivation conductor on the other side. Once the filter has been assembled, said contact points automatically create a secure and durable contact for the capacitors, providing self-fastening for the feed-through conductor inside the derivation conductor in the illustrated embodiments.

The use of multiple capacitors, i.e., a multi-step filter, enhances the buffer effect in comparison with a single filter. In this embodiment, several capacitors are connected with the derivation conductor along the feed-through conductor, encompassing said multiple capacitors in a meandering pattern. The successive capacitors in the preferred embodiments are laid out in such a way that the connecting sides contacting the feed-through conductor at the capacitor and the connecting sides contacting the derivation conductor at the capacitor alternately succeed one another.

In the preferred embodiments, the capacitors serve as protective shields between the individual filtering steps, thus reducing overcoupling between the steps and securing a high buffering effect, even at extremely high frequencies (e.g., up to the GHz range). The function of protective shields is preferably realized with capacitors having at least one capacitor electrode contacting the derivation conductor and basically running between both connecting sides of the capacitor. The L-or U-shaped detour positively influences the filtering effect, not only because of the resulting induction increase, but also by buffering high-frequency overcoupling between the filtering steps.

In other embodiments, the feed-through conductor, which is embedded between the capacitors and thus further increases the induction (and consequently reducing the low-end frequency to lower frequencies) can comprise magnetic cores (e.g., iron powder), or the derivation conductor could be at least in part spiral-shaped.

The filter following the preferred embodiments is a high-current filter, suitable for currents in the 100 A to 1000 A range and higher. Therefore, it is not a filter for communication engineering applications, but rather a filter for power supply for motor vehicles, rail cars, aircraft, telecommunication and military equipment, etc.

The filter is generally designed for tensions in the low-tension range, typically up to 60 V. In principle, a filter as recited above can also be used for higher tensions. This requires the use of capacitors with extremely small leakage flows in order to keep the derivation flows appropriately small despite of the high tensions.

Direct current is preferred as the main component for the tension to be filtered, whereby alternate currents are also possible, provided they do not exceed the low-end frequency. When operating said high-frequency filters in alternate current mode, relatively high idle currents flowing through the filter capacitors should be accepted.

The filter in a preferred application, explained below in further detail, is connected between the connected source of power for motor vehicle wiring and the wiring. The source of power has a performance of 10 kW and a tension of 12V, for example, whereby flows exceeding 800 A flow through the filter. The clock frequency of the connected source of power is 100 kHz, for example, creating high-frequency potential shares of the clock frequency (e.g., 100 kHz) and their upper waves in the direct current. Mixed effects in non-linear components often lead to significant interference exceeding 100 mHz. By connecting a sufficient number of filtering steps in series, said clocked sources of power of the filter can be used for motor vehicle wiring systems while meeting the stringent EMC regulations. The meander-shaped feed of the feed-through conductor allows for a relatively compact design of the filter, making it especially suitable to be mounted in vehicles.

Returning to FIGS. 1 through 5: These Figures show a preferred embodiment of a filter, whereby FIG. 1 is a side view, FIG. 2 a top view, FIG. 3 a front view, and FIGS. 4 and 5 sectional views.

The filter 1 embodies a feed-through conductor 3 and a derivation conductor 5. Said filter is shaped like an oblong cuboid with a nearly square longitudinal cross-section. The feed-through conductor 3 protrudes from both opposing ends 2 of the cuboid in the shape of a connector bracket 4 provided with a drilled connector hole. The exterior chassis wall of the cuboid—the opposing ends not included—create the derivation conductor 5. This derivation conductor 5 is generally connected with the ground when said filter 1 is mounted (in case of a multi-phase system, it can also be connected with a different phase than that of the feed-through conductor 3).

The examples of sectional views illustrated in FIGS. 4 and 5 show a filter 1 with five filter capacitors 6, connected between the feed-through conductor 3 and the derivation conductor 5. Capacitor 6 sections embedded between the connecting points represent sets of induction. Each group comprising an induction and capacitors 6 create a filtering step, whereby the individual filtering steps are connected in series. This means that said filter is a five-step filter according to the wiring diagram shown in FIG. 7.

The filter capacitors 6 are shaped like flat cuboids, whereby both opposing narrow sides create contacting sides 7, 8 for the capacitor electrodes embedded in the capacitors 6, and both the other narrow sides as well as the flat sides are non-conducting. Foil capacitors are preferred for said filter capacitors 6. The capacitor electrodes of said foil capacitor are at least partially disposed in parallel to the flat sides of the capacitors, providing said capacitors 6 with the above-mentioned protective shielding between the filtering stages. The flat sides of the filter capacitors are disposed perpendicularly to the lengthwise direction of the filter 1 in such a way that the connecting sides 7 are alternately embedded in the different stages at the top and bottom of the derivation conductor 5, whereby "top" refers to the filter side protruding from the connector brackets 4, and "bottom" refers to the opposite side.

The cross-section of the feed-through conductor 3 is shaped like a flat rectangle and is preferably made of copper. It is embedded inside the derivation conductor 5 in a meander-shaped pattern and directed around the jackknifed filter capacitors 6. The embodiment shown in FIGS. 1 through 5, present connector brackets 4 protruding through the bottom part of the filter 1, yet the filter capacitors 6 at the filter 1 entrance and exit connect with the top of the derivation conductor. This results in the feed-through conductor 3 being rotated about on two sides only, i.e., in an L-shaped pattern around the first and the last filter capacitor 6. On the other hand, said feed-through conductor encompasses the three interior filter capacitors 6 in a U-shaped pattern on three sides each (see FIG. 4).

FIG. 6 shows an extremely preferred embodiment having all filter capacitors encompassed by feed-through conductors in a U-shaped pattern, whereby all exterior filter capacitors are connected at the same side of the derivation conductor where the connector brackets are embedded. Besides these differences, all embodiments mentioned above and below apply to FIG. 6.

Returning to FIG. 4: In this figure, the connecting sides 7 opposite of the connecting sides 8 of the capacitors 6 are connected with the feed-through conductor, i.e., at the basis of the U-shaped section of said feed-through conductor running in the lengthwise direction of the filter (respectively, at the stud running along the lateral side of the filter at the L-shaped feed-through conductor segment.)

The electric insulation at the feed-through conductor 3 keeps it from connecting with the derivation conductor 5. This insulation runs in a lengthwise direction along the filter, as well as on both sides of the filter.

The connecting sides 7, 8 of the filter capacitors 6 and the derivation conductor 5, or the feed-through conductor 3, all comprise conductive elastic contacting elements, in this case contact springs 10. Once the filter has been assembled, said contact points automatically create a secure and durable contact for the filter capacitors, whereby the lateral stress created also provides self-fastening for the feed-through conductor 3 inside the derivation conductor 5. Instead of contact springs, the contact pieces can also be made of conductive elastomeric materials.

The derivation conductor 5 in the presented embodiments is shaped like a tube with a square cross-section. The width of the feed-through conductor 3 and the filter capacitors 6, together with the lateral insulation 9, corresponds with the interior free width of the derivation conductor 5. Perpendicular to this and square across from the filter axis, the sum of the height of the derivation conductor 3 and the filter capacitors, together with the height necessary to accommodate one upper or lower insulation 9 and two compressed contact springs 10, corresponds with the interior free height of the derivation conductor 5.

The U-shaped chassis of the filter capacitors 6 through the feed-through conductor 3 shown in the embodiments offers several advantages. From a mechanical perspective, it disposes a pocket-like holding device for the capacitors 6. From an electrical perspective, the jackknifed filter capacitors 6 function as protective shields between the different filtering steps, thus reducing overcoupling of interference between two filter stages. Said protective shielding can be reached when the capacitor electrode (inside the filter capacitor 6) contacting the derivation conductor 5 stretches at least partially parallel with the flat side of the capacitor (i.e., square across from the lengthwise direction of the filter) which is the case in conventional capacitors when relatively high capacity values are reached. Another advantage of the meander-shaped pattern directing the feed-through conductor 3 around the filter capacitors 6, lies in the fact that the distance between the sections of the feed-through conductor 3 of a connecting point 8 is relatively large compared with the effective length of the filter capacitors 6 the idle derivation flows travel through in the center of the filter because of the embodiment of said filter 1, which is altogether more compact. Extremely high interference frequencies (i.e., frequencies in the GHz range) cause so-called parasitic capacitor induction. The static balance per step required for filtering more or less corresponds with the ratio between the external induction and the parasitic capacitor induction. The relatively high external induction created by the present arrangement (based upon the considerable length of the feed-through conductor section between the capacitor connection points relative to the efficient length of the filter capacitors) therefore guarantees sufficient filtering for extremely high filter frequencies.

The filters recited in FIGS. 1 through 5 are designed for a tension of 60 V and a permanent current of 600 A of direct current, for example. The dimensions of the filter chassis (i.e., the exterior dimensions of the derivation conductor) are 50 mm×24 mm×24 mm. The feed-through conductor has a width of 20 mm. The filter counts six steps and comes with six foil capacitors of 4.7 $\mu$F, resulting in a buffering performance exceeding 100 dB in the 3 MHz to 500 MHz range, and exceeding 80 dB in the 2 MHz to 1.1 GHz range.

Figure 8:
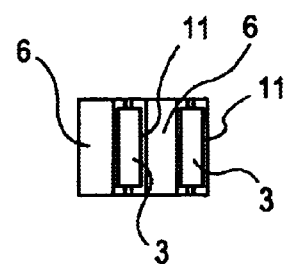
FIG. 8 shows a sectional view of a conductor with a magnetic core of FIG. 7.

FIG. 7 illustrates other embodiments having magnetic cores 11, e.g., made of iron powder, in the feed-through conductor sections between the filter capacitors 6. The word "core" should be read in the figurative sense, since the cores 11 are preferable shaped like trays encompassing the feed-through conductor, as illustrated in FIG. 8. These trays are advantageously split in half in the lengthwise direction enabling to simply pin them on top of the feed-through conductor 3 when assembling the filter. Alternatively, said feed-through conductor sections could be spiral-shaped, as illustrated in FIG. 7, reference number 12. Both measures enable a further increase of the induction of the feed-through conductor sections, and therefore shift the bottom corner frequency to lower frequencies.

Figure 9:
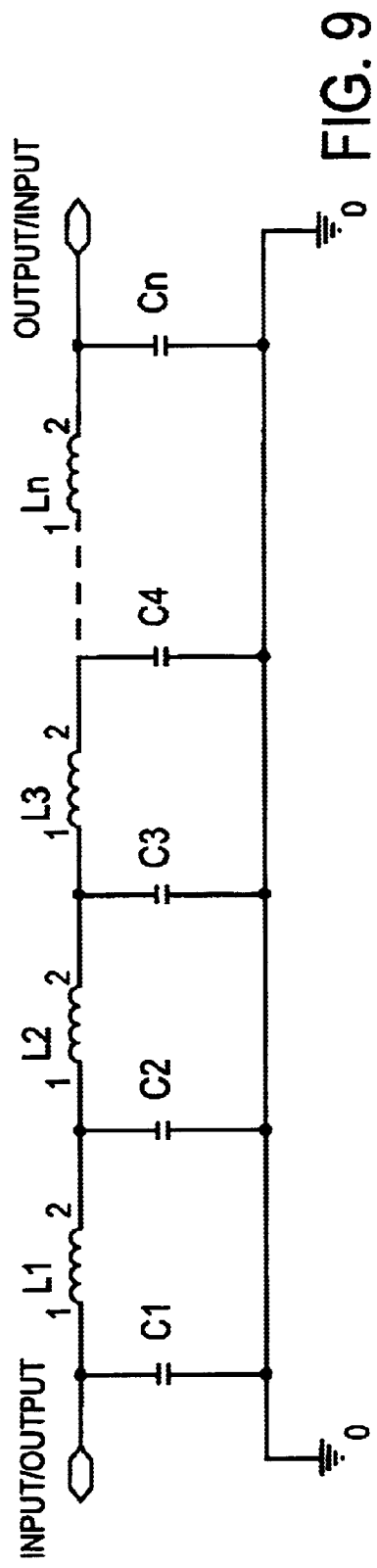
FIG. 9 shows a basic wiring diagram of a n-ary digit filter ladder of the embodiments of FIGS. 1 through 8.
Figure 10:
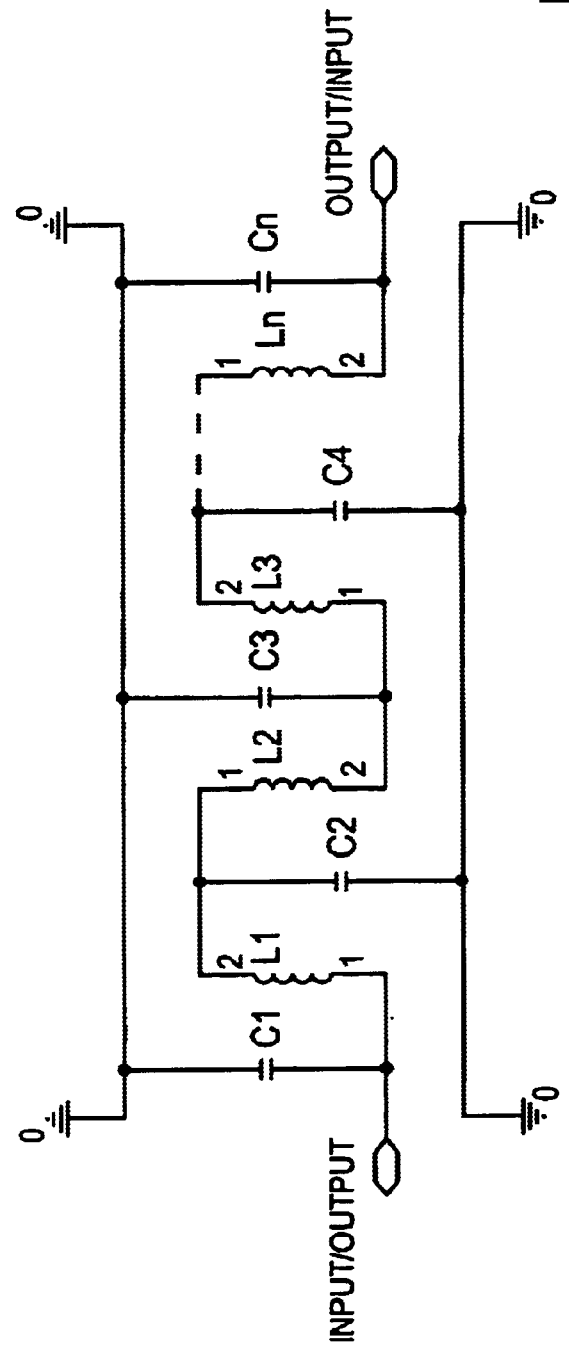
FIG. 10 shows a semi-topological basic wiring diagram according to FIG. 9.

FIG. 9 shows a basic wiring diagram of an n-ary digit filter ladder of the embodiments of FIGS. 1 through 8. The continuous connection with the inductions connected in series L1, L2, L3, . . . Ln thereby corresponds with the feed-through conductor 3; the discretely depicted inductions L1, L2, L3, . . . Ln symbolize the inductions of the sections of the feed-through conductor 3 between the connection points of the filter capacitors 6. The grounded connection in FIG. 7 corresponds with the derivation conductor 5. The capacities C1, C2, C3, C4, . . . Cn connecting the transmissions between the inductions correspond with the filter capacitor 6.

FIG. 9 shows a so-called semi-topological presentation of the basic wiring diagram illustrated in FIG. 7, i.e., a presentation allowing for a spatial arrangement of the different filter elements. For this purpose, the connection connected with the ground is depicted in the shape of two connections, incorporating the filtering elements and the connection connecting the inlet and the outlet. Both connections, which are connected with the ground, correspond with the upper and lower side of the derivation connection 5 in FIGS. 4 and 6. Accordingly, part of the capacities (C1, C3, Cn) is connected with the upper ground connection, and another part (C2, C4) with the lower ground connection. The connection connecting the inlet and the outlet is presented in a meandering shape, in accordance with the meander-shaped feed of the feed-through conductor 3 in FIGS. 4 and 6.

Figures 11, 12:
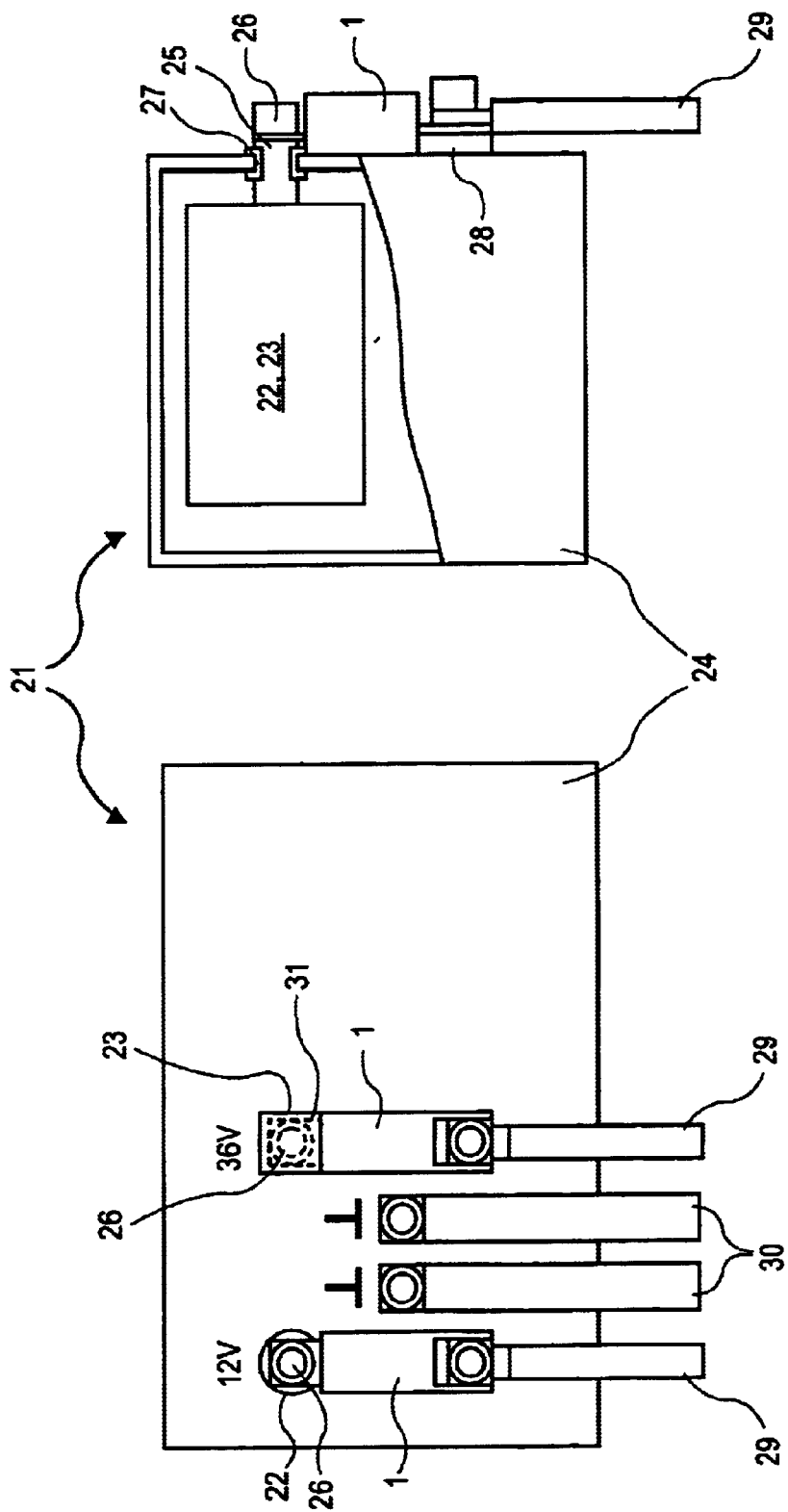
FIG. 11 shows a front-view illustrating the use of two filters following the embodiments of FIGS. 1 through 10 having a connected power source for motor vehicle wiring systems.
FIG. 12 shows a schematic side view of the power source with the filters of FIG. 11.

FIGS. 11 and 12 illustrate a filter application recited in FIGS. 1 through 10 with a wiring system 21 for a motor vehicle. The wiring system 21 includes two direct current sources 22, 23, one for 12 V, and the other for 36 V, supplying a 12 V or 36 V motor vehicle wiring system. The 36 V wiring system is mainly intended for peak achievement systems, such as electric heaters, electric ventilator pinions, electric brake systems and electric steering systems. The 12 V wiring system is mainly intended for systems preferring lower tension, such as electric light bulbs. In order to supply both tensions, for example from a higher tension supplied by a motor vehicle generator, the power supplies serve as transformers, which could be DC—DC transformers, or AC-DC transformers (depending on whether the tension supplied is direct current or alternate current). The wiring system 21 presents a metal chassis 24 with one 12 V or 36 V conductor feed-through 25, ending in a 12 V or 36 Volt connecting point 26. The conductor feed-through 25 is equipped with insulating material 27 protecting it against the chassis. A filter 1 is connected at the connecting points 26 with one of the two connector brackets illustrated in FIGS. 1 through 8. The other connector bracket 4 rests on an insulating post 28, embedded next to a mechanical elevation and insulating it against the metal chassis 24. The chassis of the filter 1 (i.e., its derivation conductor 5) contact the metal chassis, which in turn is electrically connected with the ground. Each connector bracket 4 embedded in the insulating posts 28 is connected with a power cable 29 running to the 12V or 36 V wiring system. Ground cables 30 connected with the direct current sources 22 secure the return from these wiring systems.

The direct current sources 22, 23 are connected power sources, i.e., the transformers produce the desired direct current by means of pulse modulation with the help of electronic switches. Typical elementary frequencies are in the range of 10 kHz to 100 kHz. Therefore, the direct currents at the outlet of the transformers are overlaid with interference potentials ranging from elementary frequencies to frequencies in the GHz range. The filters embedded between the transformer and the wiring system buffer the interference to such an extent that they meet the EMC-stipulations for wiring systems.

In order to avoid radiation of interference, the feed elements located outside the metal chassis 24 between the transformer and the filters 1 can be individually covered with a screen cap 31. Alternatively, it is possible (in embodiments other than those shown here) to partially or completely move the filter inside the metal chassis, whereby the connecting point of the filter leading to the wiring system ends up outside the chassis.

Said embodiments therefore offer a pass-through filter for large flows and high buffering values, even in case of high frequencies, while keeping the design compact.

All articles and existing systems mentioned in this description are included as a reference in the present patent application.

The scope of coverage is not limited to the products described in said patent application and constructed in accordance with the findings of the invention. On the contrary, the present patent covers all and any embodiments of the findings of the invention legally falling under the scope of coverage of the attached claims, be it literally or by equivalence.

What is claimed:

1. An electric filter for buffering high-frequency interference in a high-current environment, comprising:
    a feed-through conductor,
    a derivation conductor, and
    at least one capacitor switched between the feed-through conductor and the derivation conductor,
        wherein the feed-through conductor is rotated about the capacitor, of which there is at least one.

2. The electric filter as recited in claim 1, wherein the derivation conductor encompasses the feed-through conductor.

3. The electric filter as recited in claim 1, wherein the capacitor presents two connecting sides and, otherwise, insulating sides, and wherein the feed-through conductor is rotated about three sides of the capacitor, i.e., a first insulating side, a first connecting side and another insulating side, wherein the feed-through conductor is electrically connected with the first connecting side, and the second connecting side of the capacitor is electrically connected with the derivation conductor.

4. The electric filter as recited in claim 1, having said feed-through conductor rotated about the capacitor creates a pocket embedding the capacitor.

5. The electric filter as recited in claim 1, having a contact spring embedded between the feed-through conductor and a connecting side of the capacitor facing the feed-through conductor.

6. The electric filter as recited in claim 1, having a contact spring embedded between a connecting side facing the derivation conductor of the capacitor and the derivation conductor.

7. The electric filter as recited in claim 1, suitable for currents in the 100 A to 1000 A range or higher.

8. The electric filter as recited in claim 1, laid out for low-tension ranges.

9. The electric filter for buffering high-frequency interference in a high-current environment, comprising:
    a feed-through conductor,
    a derivation conductor encompassing the outside of the feed-through conductor, and
    at least one capacitor inside the derivation conductor and switched between the feed-through conductor and the derivation conductor,
        wherein the feed-through conductor encompassed by the derivation conductor is rotated about the capacitor, of which there is at least one.

10. The electric filter as recited in claim 9, wherein the capacitor not only presents two connecting sides but also insulating sides, and wherein the feed-through conductor is rotated about three sides of the capacitor, i.e., around a first insulating side, a first connecting side and another insulating side, wherein the feed-through conductor is electrically connected with the first connecting side, and the second connecting side of the capacitor is electrically connected with the derivation conductor.

11. The electric filter as recited in claim 9, having said feed-through conductor rotated about the capacitor creates a pocket embedding the capacitor.

12. The electric filter as recited in claim 9, having a contact spring embedded between the feed-through conductor and a connecting side of the capacitor facing the feed-through conductor.

13. The electric filter as recited in claim 9, having a contact spring embedded between the derivation conductor and a connecting side of the capacitor facing the derivation conductor.

14. The electric filter as recited in claim 9, suitable for currents in the 100 A to 1000 A range or higher.

15. The electric filter as recited in claim 9, laid out for low-tension ranges.

16. The electric filter for buffering high-frequency interference in a high-current environment, comprising:
   a feed-through conductor,
   a derivation conductor, and
   several capacitors inside the derivation conductor and switched between the feed-through conductor and the derivation conductor,
      wherein the feed-through conductor is rotated about the capacitor.

17. The electric filter as recited in claim 16, wherein the derivation conductor encompasses the feed-through conductor.

18. The electric filter as recited in claim 16, wherein the capacitor not only presents two connecting sides but also insulating sides, and wherein the feed-through conductor is rotated about three sides of the capacitor, i.e., around a first insulating side, a first connecting side and another insulating side, wherein the feed-through conductor is electrically connected with the first connecting side, and the second connecting side of the capacitor is electrically connected with the derivation conductor.

19. The electric filter as recited in claim 16, wherein the feed-through conductor directed around the capacitor creates a pocket embedding the capacitor.

20. The electric filter as recited in claim 16, having a contact spring embedded between the feed-through conductor and a connecting side of the capacitor facing the feed-through conductor.

21. The electric filter as recited in claim 16, having a contact spring embedded between the derivation conductor and a connecting side of the capacitor facing the derivation conductor.

22. The electric filter as recited in claim 16, suitable for currents in the 100 A to 1000 A range or higher.

23. The electric filter as recited in claim 16, laid out for low-tension ranges.

24. The electric filter as recited in claim 16, wherein the feed-through conductor encompasses the capacitor in a meandering pattern.

25. The electric filter as recited in claim 16, wherein the connecting sides contacting the feed-through conductor at the capacitors and the connecting sides contacting the derivation conductor at the capacitors alternately succeed one another.

26. The electric filter as recited in claim 16, wherein the capacitors act as protective shields between the individual stages of the filter, thus reducing overcoupling between the stages.

27. The electric filter as recited in claim 16, having induction-increasing magnetic cores embedded in the feed-through conductor between the capacitors, or the feed-through conductor is at least partially spiraled.

28. Motor vehicle wiring system with an electric filter for buffering high-frequency interference, originating from a connected power source of the motor vehicle wiring system, with said electric filter comprising the following:
   a feed-through conductor,
   a derivation conductor, and
   several capacitors switched in parallel between the feed-through conductor and the derivation conductor,
      wherein the feed-through conductor is rotated about the capacitors.

* * * * *